United States Patent
Baldwin et al.

(10) Patent No.: US 7,449,959 B2
(45) Date of Patent: Nov. 11, 2008

(54) METHODS AND APPARATUS TO DETECT IMPEDANCE AT AN AMPLIFIER OUTPUT

(75) Inventors: David J. Baldwin, Allen, TX (US);
Mayank Garg, Delhi (IN)

(73) Assignee: Texas Instruments Incorporated, Dallas, TX (US)

( * ) Notice: Subject to any disclaimer, the term of this patent is extended or adjusted under 35 U.S.C. 154(b) by 106 days.

(21) Appl. No.: 11/700,457

(22) Filed: Jan. 31, 2007

(65) Prior Publication Data
US 2008/0180177 A1     Jul. 31, 2008

(51) Int. Cl.
*H02H 7/20* (2006.01)
(52) U.S. Cl. .................... 330/298; 330/207 P
(58) Field of Classification Search .......... 330/252, 330/207 P, 298
See application file for complete search history.

(56) References Cited

U.S. PATENT DOCUMENTS

| | | | |
|---|---|---|---|
| 4,638,258 A * | 1/1987 | Crooks | 330/149 |
| 5,289,137 A | 2/1994 | Nodar et al. | |
| 7,075,373 B2 * | 7/2006 | Briskin et al. | 330/298 |
| 7,276,974 B2 * | 10/2007 | Newman et al. | 330/298 |

\* cited by examiner

*Primary Examiner*—Henry K Choe
(74) *Attorney, Agent, or Firm*—Wade J. Brady, III; Frederick J. Telecky, Jr

(57) ABSTRACT

Methods and apparatus to detect impedance at an amplifier output are described. In one example, a method of determining a relative value of an amplifier output load may include determining a current provided to the amplifier output load in response to an input signal; determining a current provided to a reference load in response to a signal based on the input signal; comparing the current provided to the amplifier output load to the current provided to the reference load; and indicating a relationship between the amplifier output load and the reference load based on the current provided to the amplifier output load and the current provided to the reference load.

23 Claims, 4 Drawing Sheets

METHODS AND APPARATUS TO DETECT IMPEDANCE AT AN AMPLIFIER OUTPUT

TECHNICAL FIELD

The present disclosure pertains to impedance detection and, more particularly, to methods and apparatus to detect impedance at an amplifier output.

BACKGROUND

An amplifier, such as an audio amplifier used to control the level of audio signals, typically includes a current fault detection mechanism. A current fault detection mechanism detects short circuits at an amplifier output (e.g., a short circuit between an amplifier output and ground). Upon detecting such a condition, the current fault detection mechanism or other associated circuitry shuts down the amplifier or the device in which the amplifier resides to protect the amplifier and/or the device from overheating and damage associated with the current fault state.

While a current fault detector is useful in detecting an output short circuit, current fault detectors do not assist in detecting amplifier output loads that are not desirable, but that are not short circuits. For example, current fault detectors are unable to detect loads that are lower or higher impedance than is desirable for good amplifier performance.

DETAILED DESCRIPTION

Example load detectors and load detection processes are described herein. The example load detectors may be used in conjunction with amplifiers, such as audio amplifiers or any other suitable amplifiers, to detect a load impedance at an amplifier output. In one example, a load detector may be configured to detect when an amplifier load impedance is below a specified reference impedance threshold. According to additional examples, an example load detector may be configured to detect when an amplifier load impedance is above a reference impedance threshold or is between a low reference impedance threshold and a high reference impedance threshold.

As described in detail below, an example load impedance detector monitors current provided to a reference impedance and compares the same to current provided to the load impedance of an amplifier. A similarly-sized magnitude voltage signal is provided to both the reference impedance and the load impedance. Thus, when the current provided to the amplifier load impedance is greater than the current provided to the reference impedance, the load impedance must be lower than the reference impedance. Of course, the reference impedance may be any selected impedance, the current through which is compared to that of the load impedance to provide impedance comparisons.

Additionally, as described in detail below, the reference impedance and the circuitry providing power (i.e., voltage and current) to the reference impedance may be scaled. That is, if a particular load impedance is to be compared to a 16 ohm reference impedance, the reference impedance need not be 16 ohms. That is, for example, the reference impedance may be 16,000 ohms (i.e., 16 Kohms) and the current detection circuitry may be appropriately calibrated by a factor of 1000, so that the current through the 16,000 ohm load is compared accurately to a scaled down version of the current running through the load impedance. The scaling of reference impedances saves current and power dissipation required to provide the current comparison. That is, rather than, for example, 10 milliamperes of current passing through the reference impedance to facilitate comparison, 0.01 milliamperes of current may be used. Of course, this results in a factor of 1000 reduction in the current required to facilitate comparison of the load impedance to a reference impedance.

Figure 1:
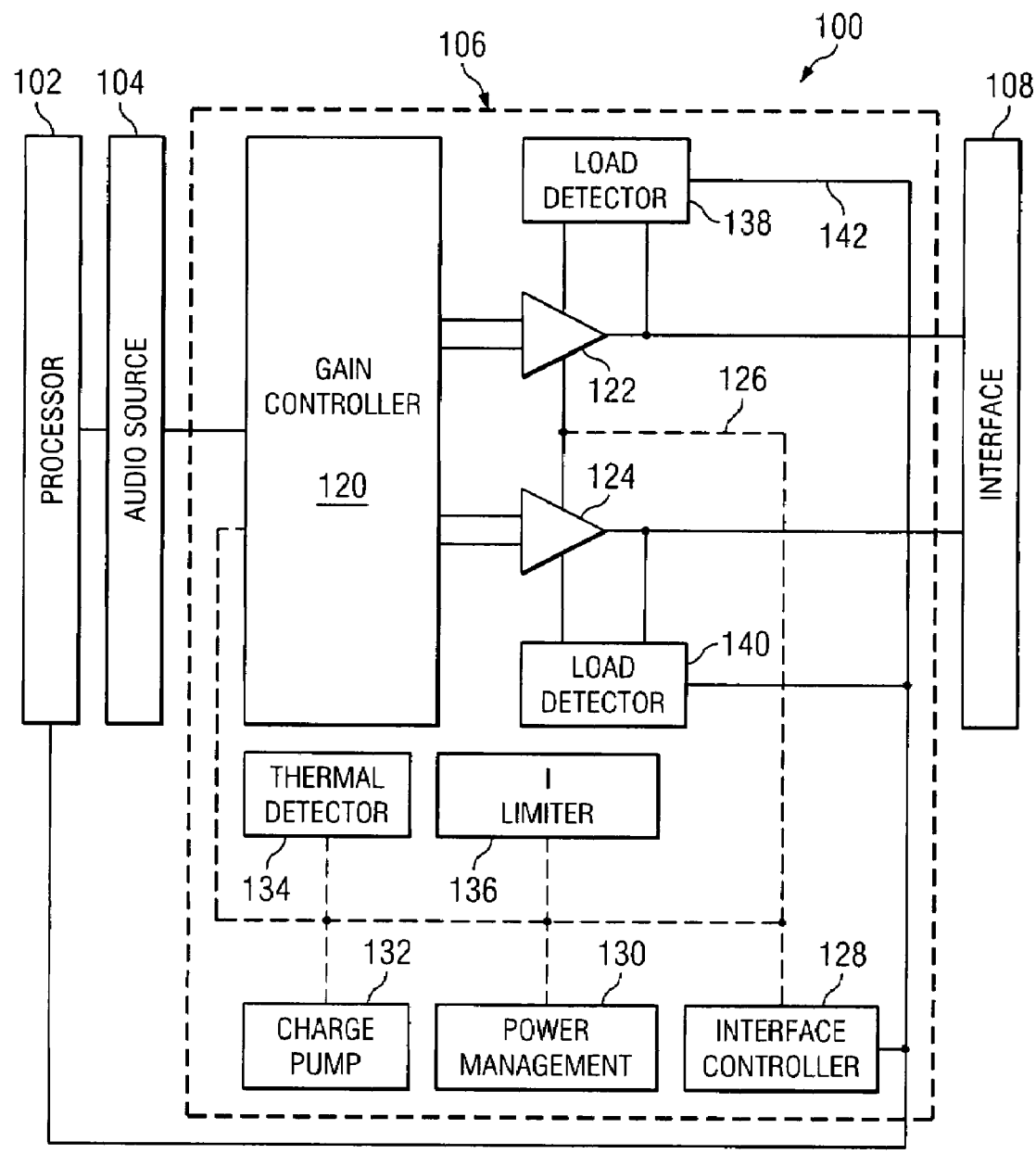
FIG. 1 is a diagram of a device including an example load detector.

Turning now to FIG. 1, example electronic equipment 100 may include a processor 102, an audio processor 104, an audio amplifier system 106, and an interface 108. The example electronic equipment 100 may be any suitable piece or pieces of electronic hardware and/or software. For example, the example electronic equipment 100 may be a personal audio player such as an MP3 player, an I-Pod, a cassette player, or any other suitable type of portable electronics. In another example, the example electronic equipment 100 may be any computing device such as a personal computer, a notebook computer, or the like. Additionally, the example electronic equipment 100 may be communication equipment such as mobile telephones, data devices such as electronic organizers, palm computers, Blackberries, etc. More generally, the example electronic equipment 100 may be any electronic equipment having an audio output port, the load impedance of which is to be monitored.

The processor 102 may be any suitable processor that facilitates the required functionality for the example electronic equipment 100. For example, the processor 102 may be a microprocessor or microcontroller that performs various functions making the example electronic equipment 100 usable by a person. Such functions may include user interface functionality, data processing, etc. The processor 102 may, in some examples, be implemented using a digital signal processor (DSP) capable of processing digital signals representative of audio and/or video and decoding and presenting the same. In one example, the example electronic equipment 100 may include a receiver that is controlled by the processor 102. The processor 102 may, in turn, receive digital signals from the receiver and pass such signals to the audio processor 104.

The audio processor 104 may be any suitable audio processing hardware and/or software. The audio processor 104 may include decoding circuitry and/or functionality for decoding digital information received in an encoded format. For example, the audio processor 104 may include hardware and/or software for decoding audio that was encoded and/or compressed prior to transmission and, thus, needs to be decoded and/or decompressed prior to presentation. Additionally, the example audio processor 104 includes circuitry and systems for converting digital signals to an analog format (D/A), such as digitial-to-analog converters. In on example, the audio processor 104 may include D/A converters for each of the left channel and the right channel to facilitate the presentation of stereo audio.

As shown in FIG. 1, the audio amplifier system 106 includes a gain controller 120 that, for example, receives from the audio processor 104 differential input signals for each of the left and right audio channels. In one example, the gain controller 120 performs, among other things, small signal amplification and passes the amplified signals to left and right amplifiers 122 and 124, respectively. The left and right amplifiers 122, 124 amplify their input signals and provide the amplified signals to the interface 108, to which earphones, speakers, etc. are coupled so that the audio may be presented to a user. Additionally, the amplifiers 122, 124 are interfaced to a bus 126 to which an interface controller 128, power management 130, and a charge pump 132 are coupled. Also coupled to the bus 126 are a thermal detector 134 and a current limiter 136.

As described below in detail, the amplifiers 122, 124 may be transistor amplifiers implemented using N-channel metal oxide semiconductor (MOS) devices, P-channel MOS devices, or any other suitable devices. As also described below, one or more of the amplifiers 122, 124 may have associated load detectors 138, 140. Generally, the load detectors 138, 140 monitor signals in and from the amplifiers 122, 124 to determine if a load provided to the amplifier output (e.g., the load to which the amplifier 122 or the amplifier 124 is connected) is proper. To communicate that the load is not proper, the load detectors 138, 140 are interfaced to an external bus 142. Further detail regarding circuitry and processes associated with an example implementation of the load detectors 138, 140 is provided below.

The interface controller 128 provides and interface, such as an I²C interface, that allows the processor 102 to control aspects of the audio amplifier system 106 via the external bus 142. For example, a user may inform the processor 102 of the desire to increase or decrease the volume of audio presented to the user. The processor 102, in turn, provides data signals representative of the volume change to the audio amplifier system 106 via the interface controller 128. The interface controller 128 then instructs the left and right amplifiers 122, 124 of the desired audio change and the amplifiers 122, 124 change their amplification or gain accordingly.

The power management 130 monitors signals from the thermal detector 134 and the current limiter 136 and determines if operation of the audio amplifier system 106 should continue. In instances during which the current limit is exceeded or the thermal detector determines that the audio amplifier system 106 is too hot, the power management 130 may shut down the audio amplifier system 106 and/or may alter the operation of the system 106.

Figure 2:
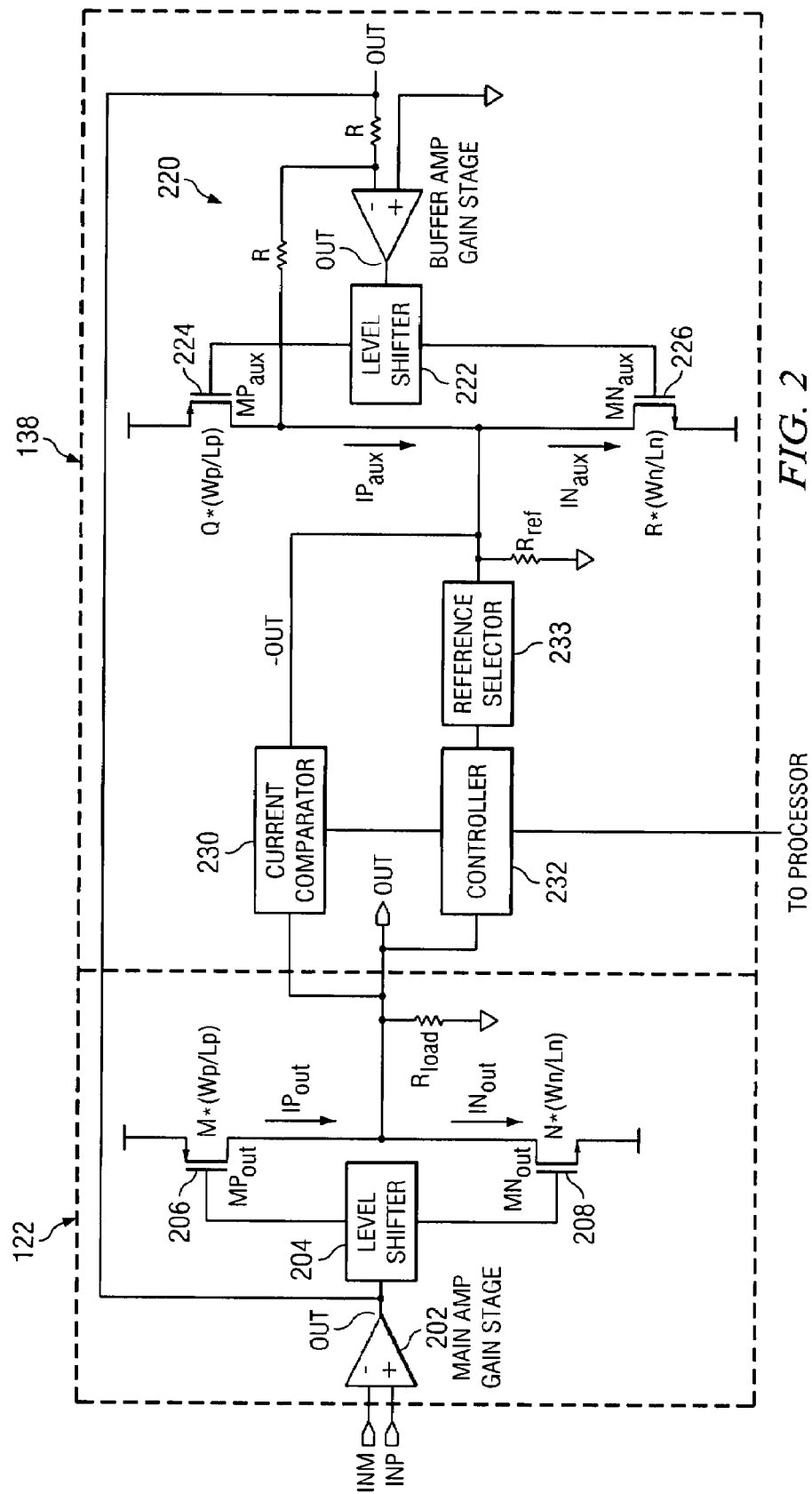
FIG. 2 is a schematic diagram of an example circuit implementation of an amplifier including an example load detector.

FIG. 2 shows an example manner in which the amplifier 122 and the load detector 138 may be implemented. Of course, other implementations are possible. Additionally, the amplifier 124 and the load detector 138 may be implemented in a similar or identical manner to that shown in FIG. 2, but for the sake of convenience and ease of explanation, FIG. 2 is described in accordance with the amplifier 122 and the load detector 138.

The amplifier 122 receives a differential input signal at a main gain stage 202, which amplifies the input signal by a fixed, pre-selected gain. The output signal from the main gain stage 202 is provided to a level shifter 204. The level shifter 204 generates output signals that are coupled to gates of field effect transistors (FETs) 206, 208. The level shifter 204 includes circuits and systems to produce output signals that cause the FETs 206, 208 to operate in an active mode of operation.

The FET 206 may be, for example, an P-channel FET having M fingers having a width to length ratio of Wp/Lp. A source of the FET 206 is coupled to a positive supply voltage. A drain of the FET 206 is coupled to a drain of the FET 208, which has its gate connected to the level shifter 204 and its source connected to a negative supply voltage. The FET 208 has N fingers, each having the dimensions Wn/Ln. The load impedance (Rload) presented to the amplifier 122 is coupled between the connected drains of the FETs 206 and 208 and ground. In one example, M(Wp/Lp) is equal to 99(30/1.4) and N(Wn/Ln) is equal to 198(15/1.4).

The load detector 138 includes a unity gain inverting buffer 220 that receives an input signal from the output of the main gain stage 202. Thus, the output signal from the unity gain inverting buffer 220 is equal in magnitude to that of the main gain stage 202, but is opposite in polarity. The output from the unity gain buffer stage 202 is coupled to a level shifter 222, which provides properly biased signal to a P-channel FET 224 and an N-channel FET 226. The FET 224 has Q fingers sized to be Wp/Lp and the FET 226 has R fingers sized to be Wn/Ln. As with the FETs 206 and 208, the FETs 224 and 226 are respectively coupled to positive and negative voltage supplies at their sources and the drains of the devices are coupled together. The connected drains provide a voltage equal in magnitude to the output signal provided to Rload, but opposite in phase.

The signal at the connected drains of the FETs 224 and 226 is the output signal provided to a reference resistor (Rref. The reference resistor is the impedance to which the load impedance (Rload) is compared. The voltages provided to Rload and Rref are equal in magnitude and, thus, will induce currents on Rload and Rref in inverse proportion to the sizes of Rload and Rref. For example, if Rload is larger than Rref, the current flowing in Rload will be smaller than that of Rref. A current comparator 230 measures the differences between the current flowing through Rload and Rref. The result of the comparison is provided to a controller 232, which also receives the signal from the main gain stage 202. The controller 232 produces an output signal indicative of whether the load impedance of the amplifier (Rload) is the proper magnitude in comparison to the reference impedance (Rref). This signal is fed back to the processor that may, for example, disable the amplifier 122 if the amplifier load impedance is too small.

Also shown is a reference selector 233, which may be used to vary the value of the reference impedance (Rref). In one example, the reference selector 233 may be a multiplexer capable of switching impedances into and out of the circuit to affect the reference impedance. That is, additional resistance may be provided in parallel with Rref to reduce the reference impedance or additional resistance may be provided in series with Rref to increase the reference impedance. Additionally or alternatively, reactive elements such as inductors and/or capacitors may be switched into the circuit to accommodate reference to complex loads.

Figure 3:
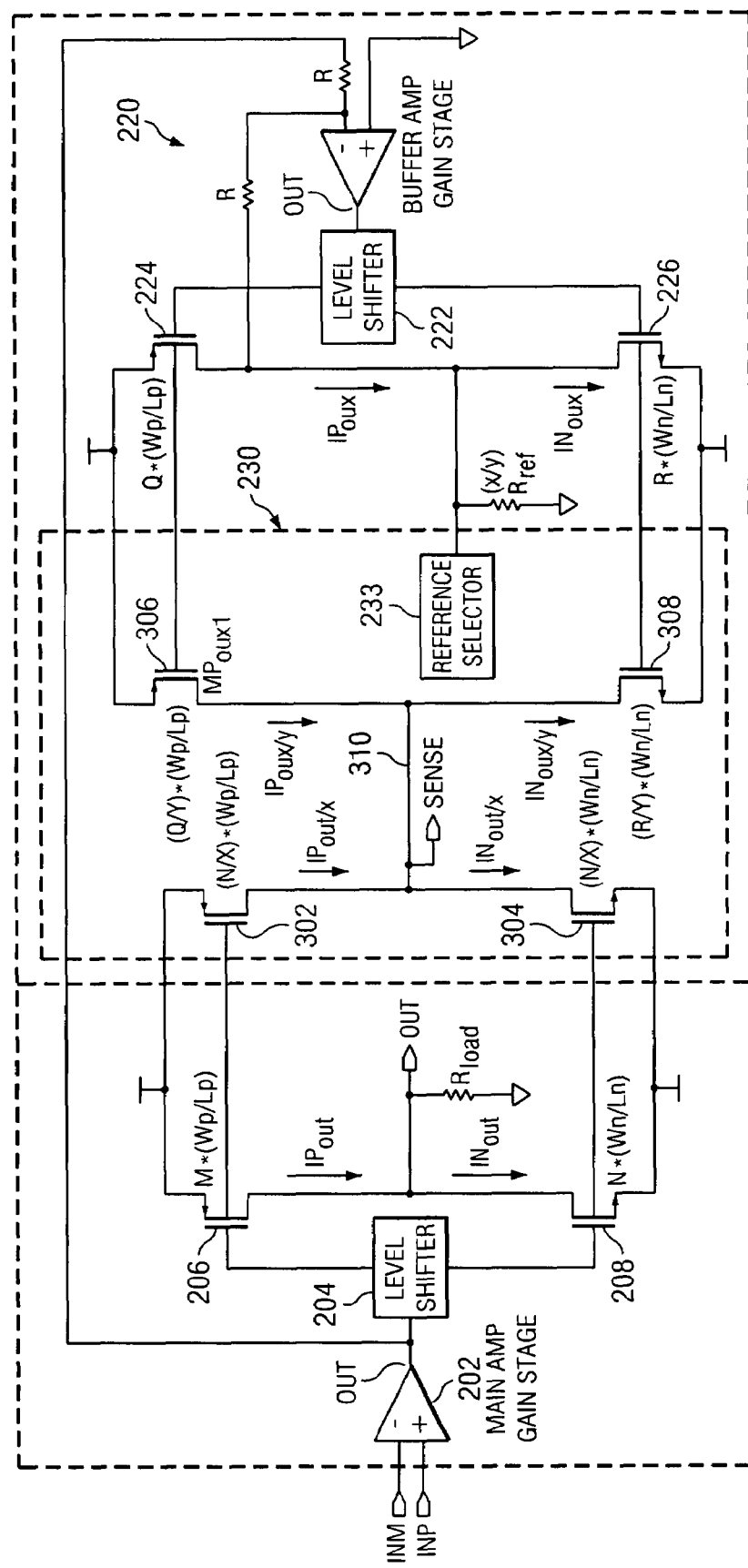
FIG. 3 is a schematic diagram of an example circuit implementation of an amplifier including an example load detector and showing additional detail of an example current comparator.

FIG. 3 shows the amplifier 122 and the load detector 138, but shows additional detail regarding the current comparator 230. As between FIGS. 2 and 3, identical reference numerals have been used to designate identical or similar components or systems. The current comparator 230 of FIG. 3 uses scaling such that the current, and therefore power, consumed by the load detector 138 is small. To that end, the reference impedance (Rref) is scaled by a ratio of x/y. In one example, the ratio of x/y may be on the order of 100 or 1000. Thus, the actual resistor used for Rref may be 100 or 1000 times the unscaled value. For example, rather than using an Rref resistor having a value of 8 ohms, which would use as much current as an 8 ohm desired load, the Rref resistor may be scaled to have a value of 800 or 8000 ohms. In one particular example R/y is equal to (4(30/1.4) and Rref is equal to 400 ohms.

The current comparator 230 uses four current mirroring FETs, each of which has its gate and source connected to the same signals as those of the FET being mirrored. For example, a FET 302 mirrors the FET 206 and, therefore, is connected to the same gate and source terminals as the FET 206. Likewise, FETs 304, 206, and 308 mirror FETs 208, 224, and 226, respectively. The drains of the FETs 302, 304, 306, and 308 are connected together at a sense node 310.

In keeping with the scaling of the Rref, the number of fingers of each of the FETs 302, 304, 306, 308 are also scaled. In particular, the number of fingers of the FETs are as follows: FET 302 is M/x, FET 304 is N/x, FET 306 is Q/y, and FET 308 is R/y. Thus, the current flowing in the FETs 302 and 304, which mirrors the current in the FETs 206 and 208, is scaled down by a factor of x. In one particular example, M/x(Wp/Lp) is equal to 1(30/1.4), N/x(Wn/Ln) is equal to 2(15/1.4), and Q/y(Wp/Lp) is equal to 4(30/1.4). As noted above, in one example, R/y is equal to (4(30/1.4) and Rref is equal to 400 ohms.

The operation of the circuit shown in FIG. 3 will now be explained with reference to a sine wave input having a positive half-cycle and a negative half-cycle. T should be understood that a sine wave has been selected for ease of description, but, in reality any signal, such as an audio signal, may be used. When the main amplifier stage 202 outputs a positive half-cycle of the sine wave, the FET 206 is turned on and current flows to Rload. The current flowing to Rload is the current required to develop the output voltage across Rload. The current flowing through Rload is scaled and mirrored by the FET 302. At the same time, an inverted version of the positive half-cycle (e.g., a negative half-cycle having the same magnitude as the positive half-cycle), is output from the unity gain buffer stage 220, which turns on the FET 226, causing current to flow from ground through Rref and to the negative supply connected to the FET 226. This current is the current required to develop the negative half-cycle of voltage across the scaled Rref. The current flowing through Rref is mirrored by and scaled by the FET 308.

During the positive half-cycle, if the current flowing through the FET 302 is greater than that flowing through the FET 308, the sense node 310 is pulled high to the voltage coupled to the source of the FET 302. That is, if Rload is smaller than Rref, which causes a greater current to flow through the FET 302, the voltage at the sense node 310 is high. Conversely, if Rload is larger than Rref and, therefore, more current flows through Rref, the voltage of the sense node 310 is pulled to the negative supply value.

During the negative half-cycle of output from the main amplifier stage 202, the FET 208 is turned on and current flows from ground through Rload and to the negative supply. The current flowing to Rload is the current required to develop the negative output voltage across Rload. The current flowing through Rload is scaled and mirrored by the FET 304. At the same time, an inverted version of the negative half-cycle (e.g., a positive half-cycle having the same magnitude as the negative half-cycle), is output from the unity gain buffer stage 220, which turns on the FET 224, causing current to flow through Rref to ground. This current is the current required to develop the positive half-cycle of voltage across Rref. The current flowing through Rref is mirrored by FET 306.

If the current flowing through the FET 304 is greater than that flowing through the FET 306, the sense node 310 is pulled low to the voltage coupled to the source of the FET 304. That is, if Rload is smaller than Rref, which causes a greater current to flow through the FET 304, the voltage at the sense node 310 is low. Conversely, if Rload is larger than Rref and, therefore, more current flows through Rref, the voltage of the sense node 310 is pulled to the positive supply value.

As explained above, for a given relationship between Rload and Rref, the value of the sense signal will be fixed for a particular half-cycle, but will alternate with each change in half cycle. Thus, a circuit such as the example controller 232 of FIG. 2 receives both the output signal and the sense signal and operates on the same to produce an amplifier disable signal that may be used to represent when Rload is insufficient in comparison to Rref.

Figure 4:
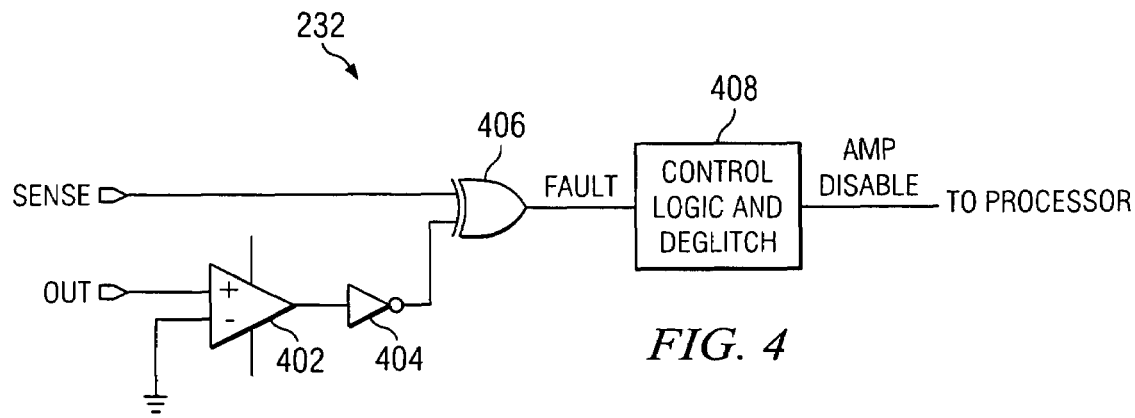
FIG. 4 is a schematic diagram of an example circuit that may be used to implement the controller of FIG. 2.

Turning to FIG. 4, the output signal is coupled to a comparator 402, which produces a logical high signal when the output signal is more positive than ground and produces a logical low signal otherwise. Thus, for positive half-cycles, the output of the comparator 402 is a logical high.

The signal from the comparator 402 is inverted by an inverting buffer 404. Thus, for positive half-cycles, the inverter produces a logical zero signal. The sense signal, which, as described above, is a logical high signal when either (1) Rload is smaller than Rref during the positive half-cycle or (2) Rload is larger than Rref during the negative half-cycle, is coupled to an exclusive OR (XOR) logic gate 406. The operation of the gate 406, as well as the other components in the system is represented in Table 1 below, which reveals that every time Rload is smaller than Rref, the output of the XOR gate 406 is a logical high (logical one). Thus, a logical one at the output of the output 406 may be used to represent a fault in which the value of Rload is lower than it should be because it is smaller than the reference impedance Rref.

TABLE 1

| Rload vs. Rref | Half-Cycle | Sense | 402 output | 404 output | 406 output |
|---|---|---|---|---|---|
| Rload > Rref | Positive | Low | High | Low | Low |
| Rload > Rref | Negative | High | Low | High | Low |
| Rload < Rref | Positive | High | High | Low | High |
| Rload < Rref | Negative | Low | Low | High | High |

The output from the XOR gate 406 is coupled to control logic and deglitch functionality 408, which processes the output from the XOR gate 406 to produce an amplifier disable signal that is coupled to the processor 102. In one example, the control logic and deglitch functionality 408 may include circuitry and systems that may, for example, debounce the signal from the XOR gate 406 to stabilize the same.

Figure 5:
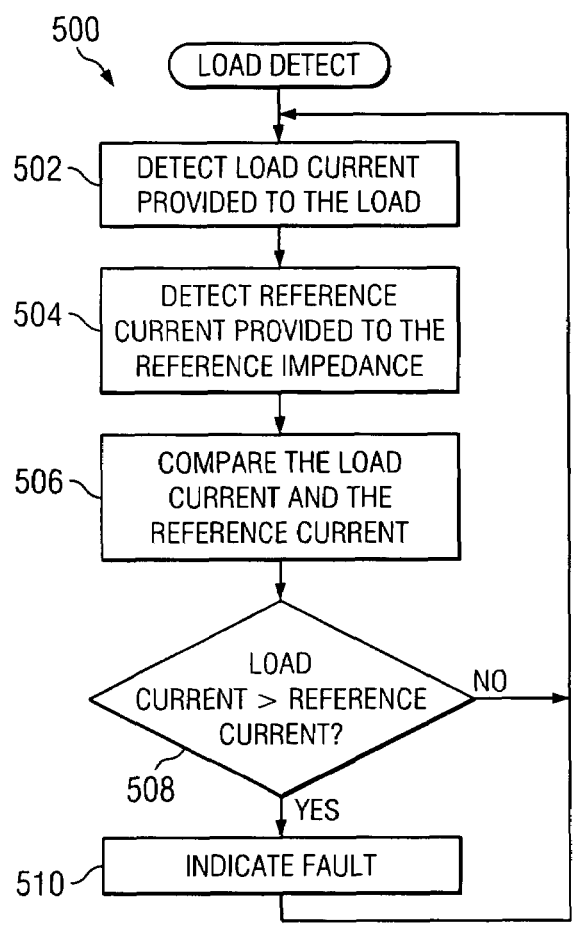
FIG. 5 is a flow diagram of an example load detection process.

FIG. 5 is a flow chart of an example load detection process 500. The process 500 may be implemented using hardware, such as the hardware described above, or using hardware in conjunction with software. For example, portions of the process 500 may be performed by any form of logic. Logic may include, for example, implementations that are made exclusively in dedicated hardware (e.g., analog and/or digital circuits, transistors, logic gates, hard-coded processors, programmable array logic (PAL), application-specific integrated circuits (ASICs), etc.) exclusively in software, exclusively in firmware, or some combination of hardware, firmware, and/or software. Furthermore, while the following process is described and shown in a particular order, those having ordinary skill in the art will readily recognize that such an ordering is merely one example and numerous other orders exist. Accordingly, while the following describes example processes, persons of ordinary skill in the art will readily appreciate that the examples are not the only way to implement such processes.

In general, the process 500 determines the current provided to a impedance load (block 502) and also determines the current provided to a reference impedance (block 504). The load and reference currents are then compared to one another (block 506). If the load current is greater than the reference current (block 508), the load is insufficient and small compared to the reference impedance and a fault is indicated (block 510). After the declaration of a fault (block 510), other portions of the system may perform tasks such as shutting down the amplifier or amplifier system, reducing available output current, etc. If there is no fault or after a fault is declared (block 510), the process 500 repeats.

As described above with regard to FIG. 3, the current mirrors provided by the FETs 302, 304, 306, and 308 provide scaled indications of the currents flowing in the load and reference impedances (Rload and Rref). In one example, the magnitudes of these currents may not be explicitly determined. Rather, the magnitudes may be compared inasmuch as the value of the sense node 310 will be either the positive supply voltage or the negative supply voltage depending on the relative values of the currents in the load and reference impedances. Thus, blocks 502-506 described above may be carried out without explicit determination of the current magnitudes and the load and reference currents are compared by monitoring the supply voltage (positive or negative supply) to which the sense node 310 is pulled.

The comparison described above (block 506) may also include other considerations, such as those implemented by the circuit of FIG. 4. In particular, the phasing of the currents and voltages in Rload and Rref are accounted-for by comparing the sense node 310 to the inverted output signal at Rload at the XOR gate 406.

Although the foregoing has described examples in which an amplifier load impedance (Rload) has been compared to a single reference impedance (Rref) to determine if the load impedance is larger than the reference impedance, other configurations are possible. In one example, multiple reference impedances may be used in the comparison. That is, a load may be compared sequentially to a number of different reference impedances to determine a range of values the load impedance may have. The different reference impedances may be switched in and out of a circuit, such as the circuit of FIG. 3, using a multiplexer. Additionally, the load impedance may be compared to the reference impedance to determine if the load impedance is larger than one or more reference impedances. Furthermore, the load impedance may be compared to a variety of different reference impedances, some of which are larger than the load and some of which are smaller than the load. That is, the load impedance may be range tested to determine if the impedance is too high or too low. Accordingly, the systems, circuits, and techniques described herein can be used to detect types of loads (different load ranges), which could be used to control system gain settings, dynamic response, or compensation for the type of load presented at the amplifier output.

While the foregoing reference load has been described as a resistive load, this is not necessarily the case. For example, the reference load may have impedance attributes that vary with attributes of the amplifier output load. For example, the impedance attributes may vary based on one or more of time, temperature, or frequency.

Although certain apparatus constructed in accordance with the teachings of the invention have been described herein, the scope of coverage of this patent is not limited thereto. On the contrary, this patent covers every apparatus, method and article of manufacture fairly falling within the scope of the appended claims either literally or under the doctrine of equivalents.

What is claimed is:

1. A method of determining a relative value of an amplifier output load, the method comprising:

determining a current provided to the amplifier output load in response to an input signal;
determining a current provided to a reference load in response to a signal based on the input signal;
comparing the current provided to the amplifier output load to the current provided to the reference load; and
indicating a relationship between the amplifier output load and the reference load based on the current provided to the amplifier output load and the current provided to the reference load.

2. The method of claim 1, wherein the current provided to the reference load is scaled.

3. The method of claim 1, wherein determining the current provided to the amplifier output load comprises a first current mirror.

4. The method of claim 3, wherein determining the current provided to the reference load comprises a second current mirror.

5. The method of claim 4, wherein the reference load is scaled.

6. The method of claim 5, wherein the second current mirror is scaled.

7. The method of claim 6, wherein the signal based on the input signal is equal in magnitude to the input signal, but is opposite in phase.

8. The method of claim 1, wherein indicating the relationship between the amplifier output load and the reference load comprises indicating that the amplifier output load is smaller than the reference load.

9. The method of claim 1, wherein indicating the relationship between the amplifier output load and the reference load comprises indicating that the amplifier output load is larger than the reference load.

10. The method of claim 1, further comprising changing the reference load to an alternate reference load having a different load impedance than the reference load.

11. The method of claim 1, wherein the reference load has impedance attributes that vary with attributes of the amplifier output load.

12. The method of claim 11, wherein the impedance attributes vary based on one or more of time, temperature, or frequency.

13. A current comparator to determine a relative value of an amplifier output load, the current comparator comprising:

a first current mirror mirroring current provided to the amplifier output load in response to an input signal;
a second current mirror mirroring current provided to a reference load in response to a signal based on the input signal; and
a sense node wherein a voltage of the sense node indicates a comparison between the current provided to the reference load and the current provided to the amplifier output load.

14. The current comparator of claim 13, wherein the reference load is scaled.

15. The current comparator of claim 14, wherein the second current mirror is scaled.

16. The current comparator of claim 15, wherein the second current mirror comprises a first transistor having scaled dimensions relative to a transistor driving the reference load.

17. The current comparator of claim 16, wherein the first current mirror comprises a second transistor having scaled dimensions relative to a transistor driving the amplifier output load.

18. The current comparator of claim 17, wherein the reference load is scaled relative to the amplifier output load.

19. The current comparator of claim 18, wherein the signal based on the input signal is equal in magnitude to the input signal, but is opposite in phase.

20. The current comparator of claim 13, wherein the voltage of the sense node indicates that the current provided to the reference load is larger than the current provided to the amplifier output load.

21. The current comparator of claim 13, further comprising a multiplexer to change the reference load to an alternate reference load having a different load impedance than the reference load.

22. The current comparator of claim 13, wherein the reference load has impedance attributes that vary with attributes of the amplifier output load.

23. The current comparator of claim 22, wherein the impedance attributes vary based on one or more of time, temperature, or frequency.

* * * * *